United States Patent
Watanabe et al.

(10) Patent No.: US 6,278,148 B1
(45) Date of Patent: *Aug. 21, 2001

(54) SEMICONDUCTOR DEVICE HAVING A SHIELDING CONDUCTOR

(75) Inventors: Takao Watanabe, Fuchu; Takuya Fukuda, Kodaira; Norio Hasegawa, Hinode-machi, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/040,457

(22) Filed: Mar. 18, 1998

(30) Foreign Application Priority Data

Mar. 19, 1997 (JP) .................................................. 9-065917

(51) Int. Cl.$^7$ .......................... H01L 27/108; H01L 29/76; H01L 29/94; H01L 31/119

(52) U.S. Cl. .......................... 257/296; 257/303; 257/306; 257/208

(58) Field of Search ..................................... 257/296, 207, 257/508, 276, 659, 303, 306, 208, 294

(56) References Cited

U.S. PATENT DOCUMENTS

| | | | |
|---|---|---|---|
| 5,243,208 | * | 9/1993 | Isomura et al. ..................... 257/211 |
| 5,300,814 | * | 4/1994 | Matsumoto et al. ................. 257/296 |
| 5,321,280 | * | 6/1994 | Sakai .................................. 257/208 |
| 5,414,655 | * | 5/1995 | Ozaki et al. ........................ 257/303 |
| 5,689,126 | * | 11/1997 | Takaishi .............................. 257/306 |
| 5,699,291 | * | 12/1997 | Tsunemine .......................... 257/296 |
| 5,861,662 | * | 1/1999 | Candelore ........................... 257/679 |
| 5,886,371 | * | 3/1999 | Shinagawa ......................... 257/207 |

FOREIGN PATENT DOCUMENTS

| | | |
|---|---|---|
| 2-121349 | 5/1990 | (JP) . |
| 3-152968 | 6/1991 | (JP) . |
| 8-212185 | 8/1996 | (JP) . |

* cited by examiner

Primary Examiner—Olik Chaudhuri
Assistant Examiner—Phat X. Cao
(74) Attorney, Agent, or Firm—Mattingly, Stanger & Malur, P.C.

(57) ABSTRACT

The present invention relates to a semiconductor device that includes a dynamic memory and logic circuits that are integrated on a single chip and that can avoid noise problems and signal delay. The portion above the memory is shielded with a shielding conductor that is biased to an equipotential. Wirings between logical blocks and bonding pads or between logical blocks are passed over the conductive layer. Wiring for logic circuits can be done in the same metal wiring layer in which the shielding conductor is provided. The shielding conductor can have a mesh-like structure to improve its integrity and wirings can be passed over conductive portions of the shielding layer to be protected from noise. In addition to the dynamic memory, other memories and analog circuits can be used instead of or in combination with the dynamic memory.

4 Claims, 13 Drawing Sheets

| WIRING LAYER | BLOCK DM (DRAM) | BLOCK BLKi LOGICAL BLOCK | WIRING BETWEEN LOGICAL BLOCKS AND PASSING OVER A DYNAMIC MEMORY |
|---|---|---|---|
| FIRST LAYER METAL | USED | USED | NOT USED |
| SECOND LAYER METAL | USED | USED | NOT USED |
| THIRD LAYER METAL | USED | USED | NOT USED |
| FOURTH LAYER METAL | USED AS AN ELECTRICAL SHIELD | USED | NOT USED |
| FIFTH LAYER METAL | NOT USED | USED | USED |
| SIXTH LAYER METAL | NOT USED | USED | USED |

FIG. 3

SEMICONDUCTOR DEVICE HAVING A SHIELDING CONDUCTOR

FIELD OF THE INVENTION

This invention relates to a semiconductor device in which a plurality of functional blocks formed of a plurality of transistors are integrated on the same semiconductor chip. More particularly, the present invention relates to a semiconductor device in which functional blocks such as dynamic memories, analog circuits which are susceptible to noises, and digital logic circuits are integrated on the same semiconductor chip.

BACKGROUND OF THE INVENTION

Recently, with an advance in the degree of integration of large-scale integrated circuits (LSIs), it has been possible to integrate a large-scale logical circuit formed of large capacity memories and digital circuits, operation circuits, and analog circuits on a 1 cm×1 cm semiconductor chip, for example. In the near future, it is expected that so-called system-on-silicon, in which the whole system is integrated using such a chip, will be realized.

Japanese Patent Laid-Open No. 212185 (1996) discloses an example in which a large capacity memory and a CPU (Central Processing Unit), which is a large scale logic circuit, are integrated on the same chip. In this example, the memory is provided on the edge portion of the chip while logic circuits such as a CPU, peripheral circuits and interface circuits are arranged on the central portion of the chip. When the memory is provided only at the edge portion of a chip, as described in the prior art, there is the problem that the degree of freedom of a chip layout is lowered. Particularly, in an ASIC (Application Specific Integrated Circuit) realizing a function desired by users using a memory core, a CPU core, and the like, the decrease in the degree of freedom of the chip layout leads to an increased chip area.

The present inventor has studied the chip layout shown in FIG. 2, in which a dynamic memory and logical circuits are integrated. The semiconductor chip CHIP comprises logical blocks BLK1 and BLK2 each formed of digital circuits, and a dynamic memory DM disposed between the logical blocks BLK1 and BLK2, and other elements. The logical block BLK1 includes a logical circuit LC1 while the logical block BLK2 includes a logical circuit LC2. The blocks are connected to each other with the wiring WR1. Other wiring connections besides WR1 are omitted for simplification.

Logical blocks BLK1 and BLK2 are arranged on both sides of the dynamic memory DM. Hence, when an output terminal of the logic circuit LC1 is connected to an input terminal of the logic circuit LC2, its shortest route crosses over the dynamic memory DM. However, upon taking into consideration the influence on signals on WR1 caused by noises generated from the dynamic memory DM as well as the change in potential influenced upon the dynamic memory DM due to wiring WR1, the wiring must be detoured around the dynamic memory DM to ensure stable operation. However, with a large number of wiring lines connecting the logical block BLK1 with the logical block BLK2, such a detouring procedure causes an increase in wiring area, thus increasing the chip area. Moreover the problem arises that the wiring length becomes long so that the wiring delay makes it difficult to operate at high speed.

Of course, if only the wiring WR1 is preferentially considered, the length of the wiring WR1 can be shortened by closely arranging the blocks BLK1 and BLK2. However, since there are many wiring layers between logical blocks and a dynamic memory and many wiring layers between logical blocks and bonding pads, in addition to the wiring WR1 between blocks, the layout of functional blocks cannot generally be determined only by considering a specific wiring. As a result, memories or analog circuits must be arranged between a plurality of logic blocks or between logic blocks and bonding pads to be connected to each other with wirings.

Japanese Patent Laid-Open No. 121349 (1990) discloses that a cell using a circuit, internally including a node, which performs a dynamic operation is covered with a grounded wiring layer while a wiring between cells is formed over the grounded wiring layer. Moreover, Japanese Patent Laid-open No. 152968 (1991) discloses that a metal layer connected to the ground potential is formed between the wiring layer within a cell and the wiring layer between cells. However, these references do not teach the integration of dynamic memories and logical circuit blocks on a single semiconductor substrate. Moreover, the references do not teach the passing of wiring provided between logical blocks over the upper portion of the dynamic memory nor the necessity of doing so. In the prior art, the metal wiring layer, where a shielding metal is provided, is used only for shielding. The references do not teach that the metal wiring layer is used to pass signal wirings for a logical circuit.

SUMMARY OF THE INVENTION

Generally speaking, in an LSI integrating large-scale logic circuits and operation circuits, each having a large capacity memory and digital circuits, and analog circuits such as analog-to-digital converters and digital-to-analog converters, many wirings are needed for connections between functional blocks or between functional blocks and bonding pads. Hence, there is a problem in that the area occupied by the wirings results in an increased chip area and wiring delay. Furthermore, another important problem is that electrical noise generated from the signal lines affect the operation of analog circuits and digital circuits, which are susceptible to noises. Also, noises generated from a memory may induce noises in signal lines.

The first object of the present invention is to provide a memory-logic hybrid chip in which a dynamic memory and logical circuit blocks are integrated on a semiconductor substrate, so as to prevent the wirings and the chip area from being increased and to avoid the above-mentioned problems regarding noises and wiring delay.

The second object of the present invention is to provide a semiconductor device that can prevent the wirings and the chip area from being increased in such a manner that electrical noises induced in signal lines do not adversely affect the operation of a noise susceptible circuit portion.

A summary of typical aspects of the invention disclosed in the present application will be briefly described below.

In order to achieve the first object, according to the present invention, among logical blocks and dynamic memories integrated on the same semiconductor chip, upper portions of the dynamic memories are shielded with a conductive layer biased to the same equipotential. Wirings are passed over the conductive layer between the logical block and bonding pads or between a logical block and another logical block.

The dynamic memory generates coupling noises because a number of data lines are simultaneously charged when a sense amplifier amplifies a read-out signal. Immediately before the sense amplifier amplifies a read-out signal, the data line comes to an electrically floating state, so that the dynamic memory is susceptible to external noises. Generally speaking, the logical circuit requires more wiring layers than the memory circuit. In such a memory-logic hybrid chip, the memory section does not require a large number of wiring layers in comparison with the logic section. Hence, a feature of the present invention is that a shielding conductor is formed above the memory section which is susceptible to noise and wiring for a logic section can be performed in the same layer as that of the shielding conductor. This means that a memory-logic hybrid chip that can solve problems of noises and the increased chip area can be provided.

According to a more preferred mode of the present invention, the shielding conductor is also connected to the plate electrode of a memory cell capacitor. Since the shielding conductor is connected to the ground potential and acts as a power supply line to the plate of the memory cell capacitor, the configuration can be simplified.

Moreover, according to the present invention, to achieve the second object, a shielding conductor is disposed over the circuit area susceptible to noises, whereas a metal wiring layer in the same layer as the shielding conductor is used for the wiring of another circuit region, instead of the shielding conductor. This configuration does not require any special wiring layer for only the shielding conductor. In metal wiring layers where a shielding conductor is disposed, the region where no shielding conductor is disposed can be effectively used as the wiring region. Hence, an increase in chip area due to the wirings can be suppressed while functional blocks such as analog circuits or memories which are susceptible to noises can be protected from noises.

These and other, features and advantages of the present invention will become more apparent in view of the following detailed description of the present invention in conjunction with the attached drawings.

BRIEF DESCRIPTION OF THE DRAWINGS

FIG. 3 is a table showing the selective use of a multi-layer interconnection in a semiconductor device according to an embodiment of the present invention;

DETAILED DESCRIPTION OF THE PREFERRED EMBODIMENTS

Figure 1:
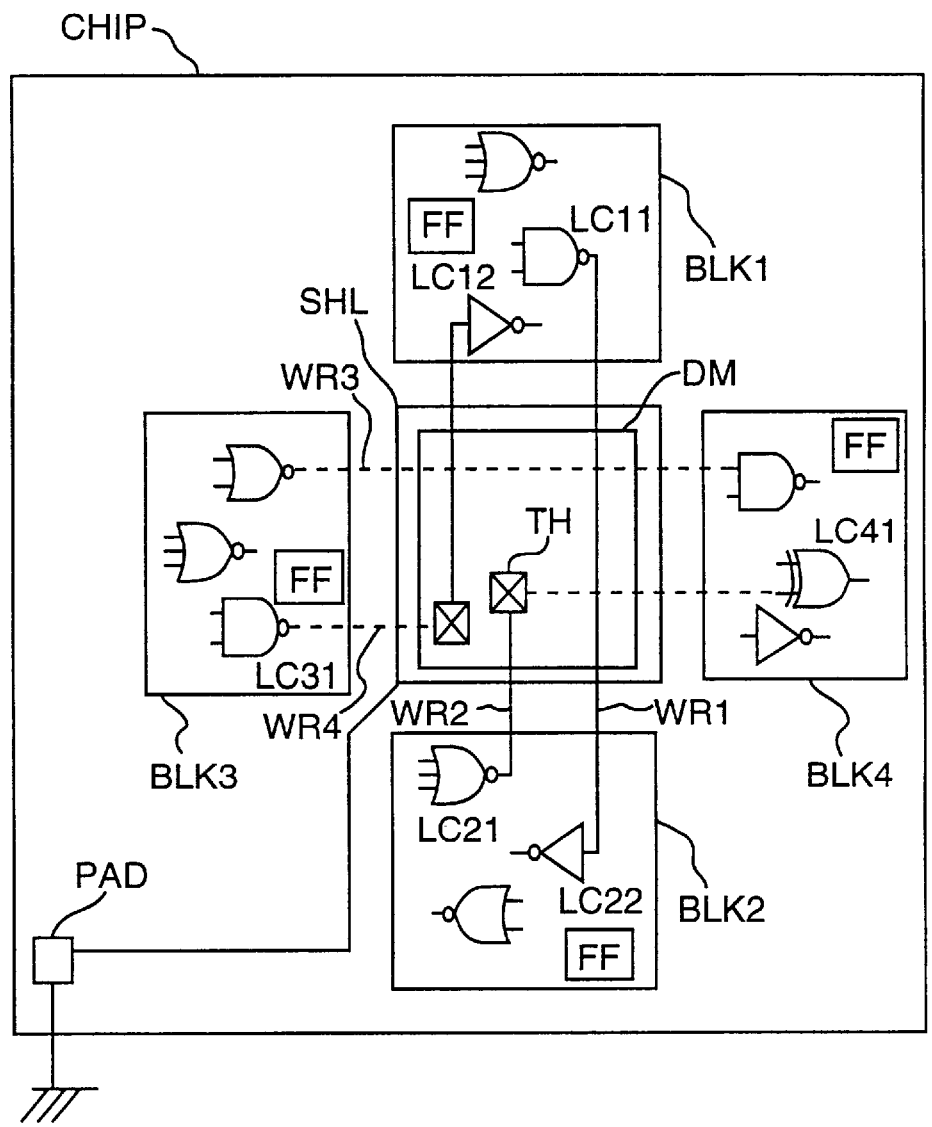
FIG. 1 shows a semiconductor device in which dynamic memory sections are shielded with a shielding conductor, according to an embodiment of the present invention.
Figure 2:
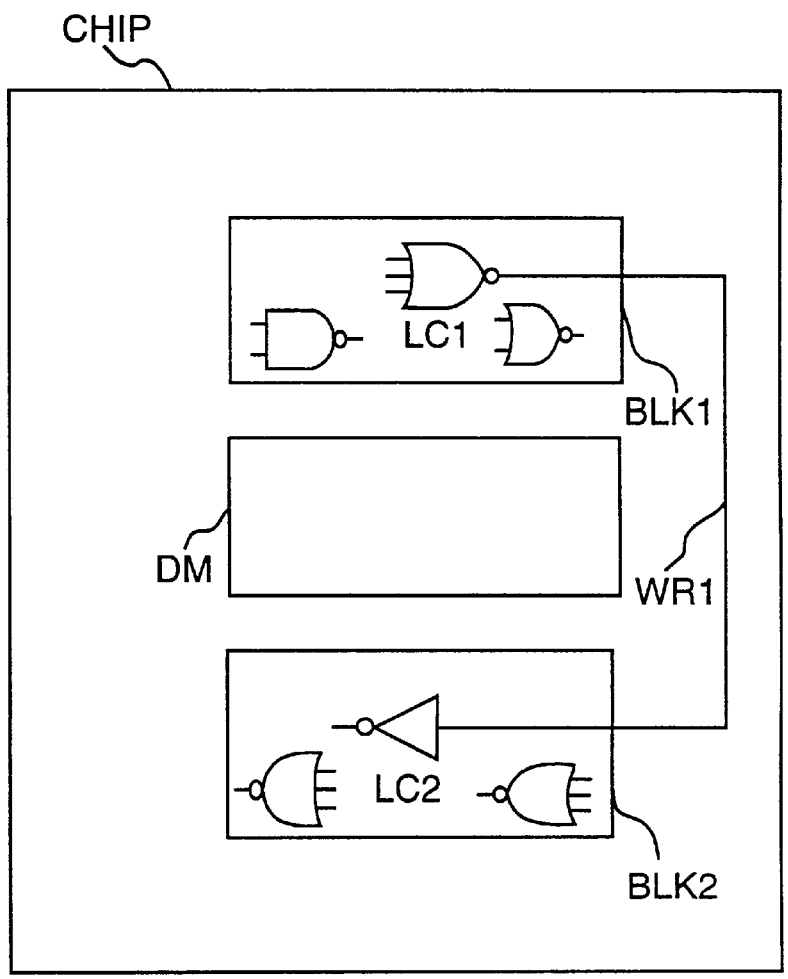
FIG. 2 shows an example where a memory is disposed between logical circuit blocks.

FIG. 1 conceptually shows an embodiment of the present invention. A semiconductor chip CHIP comprises logical blocks BLK1, BLK2, BLK3, and BLK4 each formed of digital circuits, a dynamic memory DM arranged among the logical blocks, and the like, all formed on a single semiconductor substrate. The logical block BLK1 is formed of a logic circuit LC11 and LC12, a flip-flop FF, and the like. The logical block BLK2 is formed of logic circuits LC21 and LC22, a flip-flop FF, and the like. The logical block BLK3 is formed of a logic circuit LC 31, a flip-flop FF, and the like. The logical block BLK4 is formed of a logic circuit LC41, a flip-flop FF, and the like. The blocks are mutually connected with the wiring layers WR1, WR2, WR3, and WR4. Different wiring layers are connected together through contacts TH. Though the wirings WR3 and WR4, via contacts TH, are represented with broken lines, FIG. 1 shows that the wiring layers WR3 and WR4 are different from the wirings shown by solid lines. The conductor SHL covers the upper portion of the dynamic memory DM. The dynamic memory DM includes peripheral circuits (not shown) such as a memory cell array and sense amplifiers. The conductor SHL covers the memory cell array and peripheral circuits. The conductor SHL is grounded through a bonding pad PAD. Here, the word "grounded" means that a conductor is biased to a predetermined potential which does not substantially change with time, namely brought to an AC-grounded state.

For simplification, elements which do not need to be specifically discussed, including among bonding pads, wiring layers, and other functional blocks, are omitted in FIG. 1. The semiconductor chip CHIP is encapsulated in a plastic package using a resin molding technique. The bonding pads PAD are connected with leads of the package by means of bonding wires. The conductor SHL is grounded through an external lead of the package. As clearly understood from FIG. 1, the wirings WR1, WR2, WR3, and WR4 pass over the dynamic memory DM. For that reason, the chip area does not increase due to this wiring arrangement. Moreover, the above-mentioned structure allows the logical blocks to be connected through a nearly shortest route, thus enabling a small wiring delay and high-speed operation. Moreover, since the dynamic memory DM is shielded with the conductor SHL biased to the equipotential, generation of noises due to interference between the memory and the passing wiring layer can be minimized. For that reason, even if the wiring is passed over the upper portion of the dynamic memory DM, the memory and digital logic circuits can stably operate in an error-free state.

The dynamic memory DM generates coupling noises because many data lines (not shown) are simultaneously charged when a sense amplifier amplifies a read-out signal (not shown). Immediately before a sense amplifier amplifies a read-out signal, the data lines are in an electrically floating state. As a result, the dynamic memory is very susceptible to external noises. Hence, shielding electrically as in the present embodiment is very effective in permitting use the upper portion of the dynamic memory DM as a wiring area.

In the present embodiment, the dynamic memory DM has been described as an example. However, even when an analog circuit is integrated, an upper portion of such circuit can be utilized as a wiring area by performing a shielding process like the present embodiment. If the bonding pad connecting a shielding conductor, the bonding pad for grounding the functional block, and the like, are made common, the potential may vary when the functional block is operated. As a result, the functional block underlying the shielding conductor or through-wirings formed over the upper conductor may produce noise. In such a case, it is effective to form a dedicated bonding pad connected with the shielding conductor.

There may be a problem that when adding another step to a normal manufacturing process in order to prepare the shielding conductor SHL shown in FIG. 1, there may be an increase in the manufacturing cost. In that case, the method of realizing the shielding conductor SHL by using the multi-layer wiring as shown in FIG. 3 is effective. Here, it is assumed that a six layered metal wiring is used. The first to third layers among the six layers are used for the block of the dynamic memory DM. The fourth layer is used as a shielding layer. Moreover, the first to sixth layers are used for the logical block. The fifth layer and the sixth layer are used as the wirings between the blocks. In such a configuration, the embodiment of FIG. 1 is realized without increasing the number of steps.

Recent dynamic memories generally use a three layered metal wiring structure. However, it is desirable that the logic circuits use a multi-layer wiring structure such as a five or six layer structure to increase the degree of integration and operating speed. Hence, in a memory-logic hybrid chip, a shielding conductor is disposed in the fourth wiring layer or an upper wiring layer, that is not used for the memory. The same wiring layer as the wiring layer where the shielding conductor is disposed is formed in the logic circuit section. Wirings between logical blocks are passed over the layer that is higher than the shielding conductor and between logical blocks. Thus, a suitable memory-logic hybrid chip that can prevent the chip area from increasing due to an increase in wiring can be realized.

Figure 4:
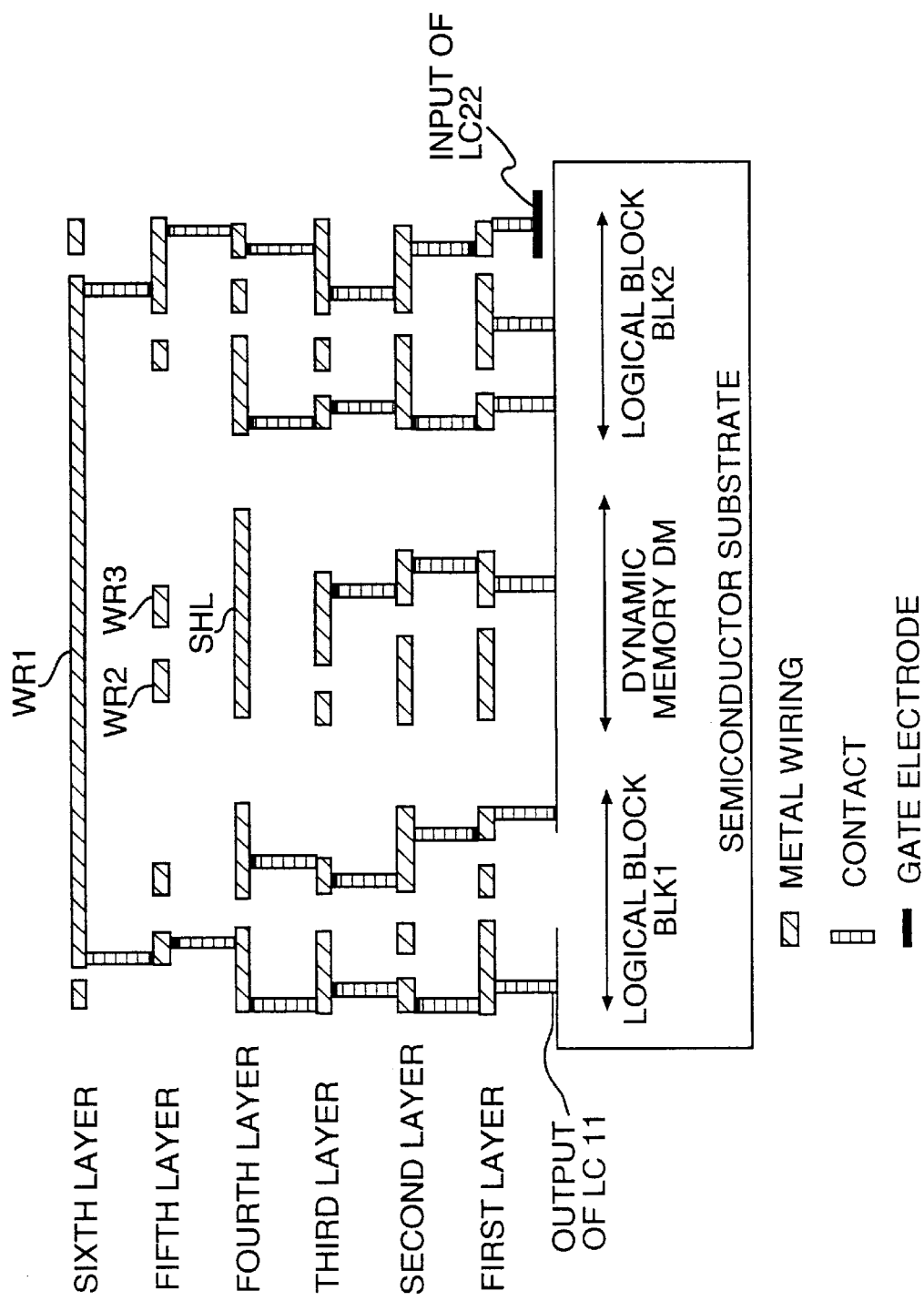
FIG. 4 is a schematic diagram showing the cross-sectional structure of a semiconductor device of an embodiment according to the present invention.

FIG. 4 is a cross-sectional view showing a wiring portion of the embodiment of FIG. 1 based on FIG. 3. FIG. 4 is a cross-sectional view taken along the wiring WR1. Actually, wirings are large in number and have a complicated connections. FIG. 4 shows the wiring layers in a simplified manner for easy understanding. Transistors and memory cells are omitted. As understood from FIG. 4, the shielding conductor SHL is formed in a fourth-layer wiring. The output of the logic circuit LC11, within logical block BLK1, is connected to the input of the logic circuit LC22, within logical block BLK2, by using a sixth-layer wiring passing above shielding conductor SHL. Two fifth-layer wirings WR2 and WR3 also pass above the shielding conductor SHL, but below wiring WR1. It should be understood that the relative layers through which WR1 passes with respect to WR2 and WR3, is a matter of design choice and can be modified as needed for any particular application.

As described with reference to FIGS. 3 and 4, the shielding conductor SHL can be formed in the wiring layer. Thus, an increase in cost due to an increased number manufacturing steps is avoided.

FIG. 1 shows an example of shielding a functional block. However, the present invention is effective even when a plurality of functional blocks are shielded. In this case, the conductor for shielding can be shared by a plurality of functional blocks. In some cases, the shielding conductor may be preferably divided. As described above, because many data lines are charged simultaneously when a sense amplifier amplifies a read-out signal, coupling noise may occur.

As mentioned previously, immediately before a sense amplifier amplifies a read-out signal, the data line comes to an electrically floating state, so that the semiconductor chip is susceptible to external noises. Hence, if two dynamic memories are operating at different timings, that is, when a sense amplifier in one memory is amplifying a read-out signal just before a sense amplifier in the other memory amplifies a read-out signal, it can be considered that noises induced via the shared shielding conductor cause the latter memory to operate erroneously.

Figure 5:
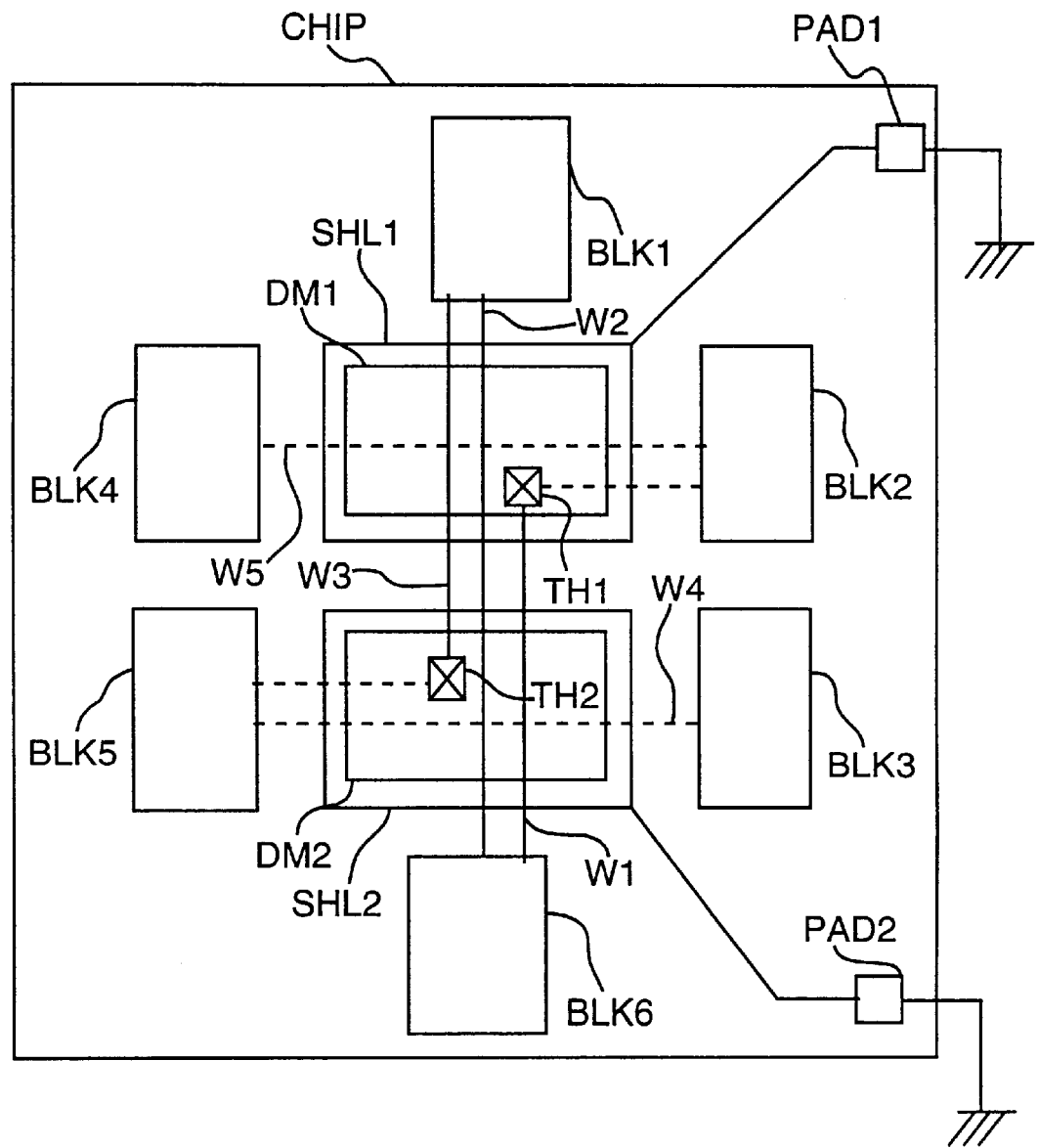
FIG. 5 is a cross-sectional view showing a semiconductor device having a separated shielding conductor according to another embodiment of the present invention.

FIG. 5 shows a semiconductor device including two dynamic memories. The semiconductor chip CHIP includes logical blocks BLK1, BLK2, BLK3, BLK4, BLK5, and BLK6, each formed of digital circuits, and dynamic memories DM1 and DM2 arranged among the logical blocks. The logical block BLK6 is connected to the logical block BLK2 by means of the wiring W1. The logical block BLK6 is connected to the logical block BLK1 by means of the wiring W2. The logical block BLK1 is connected to the logical block BLK5 by means of the wiring W3. The logical block BLK3 is connected to the logical block BLK5 by means of the wiring W4. The logical block BLK2 is connected to the logical block BLK4 by means of the wiring W5. Different wiring layers are connected through the contacts TH1 and TH2. The wirings shown by broken lines are different from the wirings shown by solid lines.

The conductor SHL1 is provided so as to cover the upper portion of the dynamic memory DM1 while the conductor SHL2 is provided so as to cover the upper portion of the dynamic memory DM2. The conductor SHL1 is grounded through the bonding pad PAD1 while the conductor SHL2 is grounded through the bonding pad PAD2. For easy understanding, elements which are not described among bonding pads, wirings, and function blocks are omitted in FIG. 5. As in the first embodiment, the semiconductor chip CHIP is encapsulated in a plastic package using a resin molding technique, or the like. The bonding pads PAD are connected to the leads of the package by means of the bonding wires. The conductor SHL can be grounded by grounding the external leads of the package.

In the embodiment shown in FIG. 5, the conductor SHL1 shielding the dynamic memory DM1 is separated from the conductor SHL2 shielding the dynamic memory DM2. Electric power is supplied through different bonding pads PAD1 and PAD2. This structure can minimize the influence of noises induced between the dynamic memories DM1 and DM2 via the shielding conductor. For that reason, the semiconductor device can be stably operated particularly at high-speed operation.

In the embodiment shown in FIG. 5, the semiconductor chip includes two dynamic memories. The present invention is applicable to cases where the semiconductor chip includes many dynamic memories or a plurality of functional blocks such as analog circuits and different kinds of functional blocks such as where memories and analog circuits are integrated.

Next, the structure of a semiconductor device and the fabrication steps to realize the semiconductor device of the present invention will be described below in conjunction with FIGS. 6 to 9.

Figure 6:
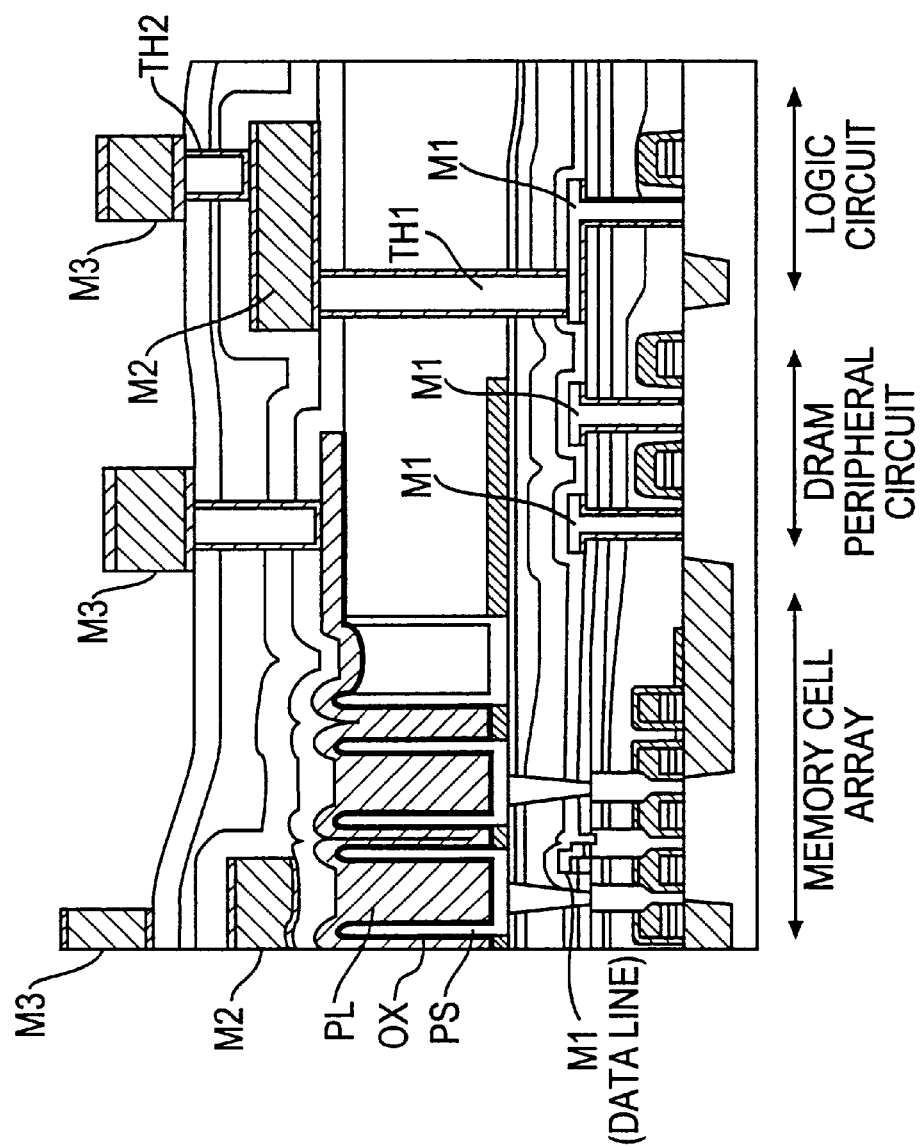
FIG. 6 shows a cross-sectional structure for explaining the process of forming the third-layer metal wiring in a semiconductor device according to an embodiment of the present invention.

FIG. 6 is a cross-sectional view showing a semiconductor device structure in which the third-layer metal wiring has been completely fabricated. The process for fabricating the structure shown in FIG. 6 is similar to the process for fabricating a conventional DRAM having MOS transistors and crown-type capacitors, and hence a detailed description will be omitted. Here, a DRAM memory cell with a three-dimensional structure called the crown structure has been shown. However, the present invention is not limited only to the semiconductor device including memory cells each having the crown structure. It is obvious that the present invention is also applicable to semiconductor devices each including a DRAM having either so-called trench-type memory cells in which capacitors of memory cells are formed in the semiconductor substrate or memory cells having capacitors with a known structure.

In FIG. 6, M1 represents a first-layer metal wiring; M2 represents a second-layer metal wiring; and M3 represents a third-layer metal wiring. TH1 represents a via hole through which the first-layer metal wiring is connected to the second-layer metal wiring. PS, OX, and PL represent layers where capacitors of memory cells are formed. PS represents a polysilicon layer as an electrode connected to a transistor. OX represents an oxide film as a dielectric film. PL represents a plate layer being an electrode connected to the ground potential.

Also illustrated is a memory cell array section, a DPAM peripheral circuit section, and a logic circuit section, as viewed from left to right. FIG. 6 shows a semiconductor structure whose scale is dramatically changed for easy understanding and shows only a limited number of transistors. For ease of understanding, diffusion layers for forming transistors in the semiconductor substrate are omitted.

Figure 7:
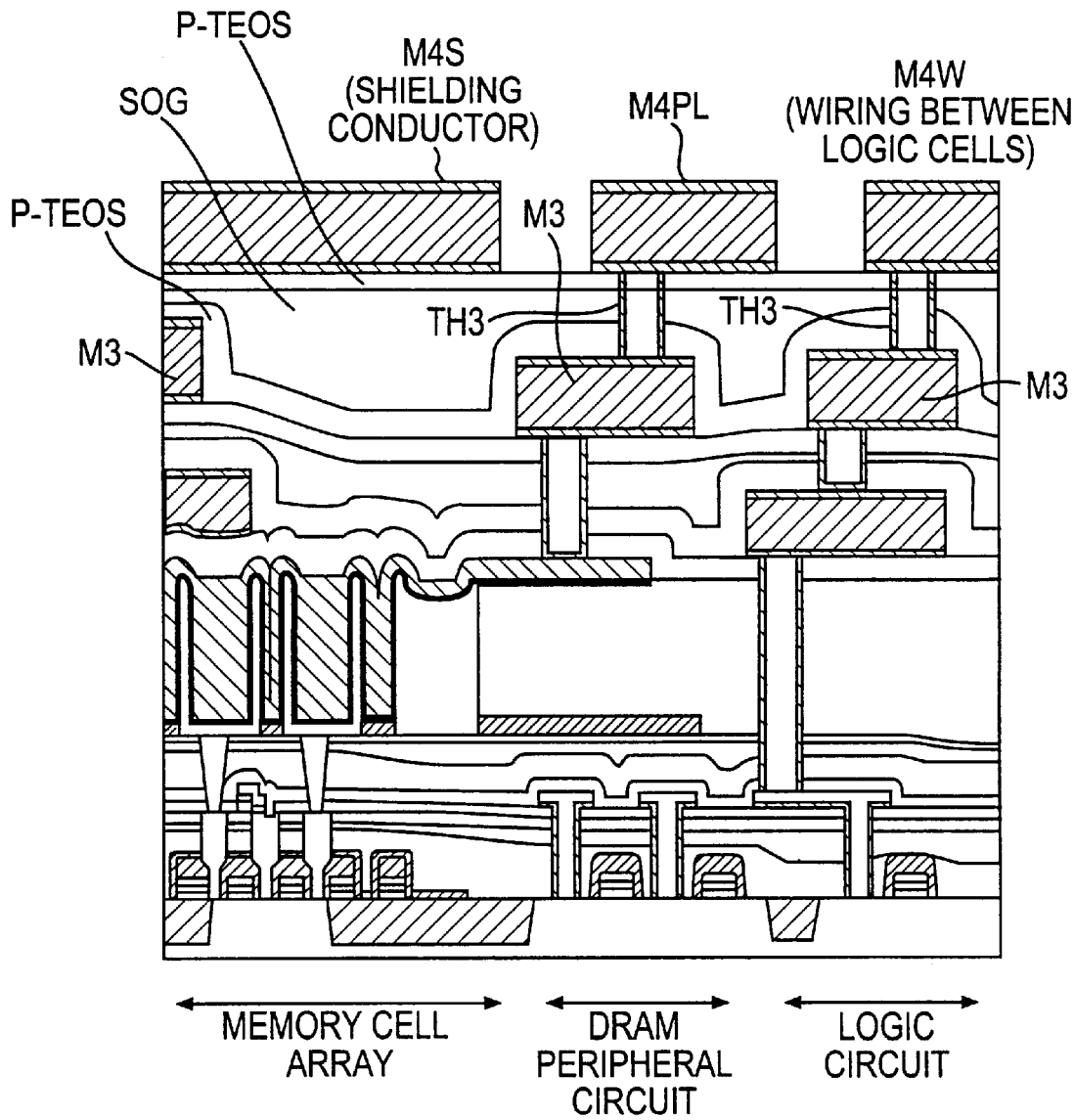
FIG. 7 shows a cross-sectional structure for explaining the process of forming the fourth-layer metal wiring in a semiconductor device according to an embodiment of the present invention.

Next, the steps for forming the fourth-layer wiring and the upper structure will be described below with reference to FIGS. 7 to 9.

First, an inter-layer insulating film is formed between the third-layer metal wiring M3 and the fourth-layer metal wiring M4. Next, a first inter-layer oxide film P-TEOS is formed by a chemical vapor deposition (CVD) method. Next, a second inter-layer oxide film SOG is formed by coating and then is flattened by a chemical-mechanical polishing method (so-called CMP). Moreover, a third inter-layer oxide film P-TEOS is formed on the flattened oxide film. In the same step (using metal film deposition, photo-lithography and dry etching), the shielding conductor M4S, the plate power supply line M4PL, and the wiring layer M4W between logic cells within the logical block are formed of the fourth-layer metal wiring M4. Since the wiring layer for supplying power to the plate depends on the layout, the fourth layer or upper wiring layers, if necessary, may be used, or only the first to third layers can be formed without the fourth and other layers.

The shielding conductor M4S covers the upper portion of the memory cell array section but may be formed to also cover the peripheral circuit section of the dynamic memory.

The steps for forming the sixth-layer metal wiring after the step shown in FIG. 7 will be described below referring to FIG. 8.

Figure 8:
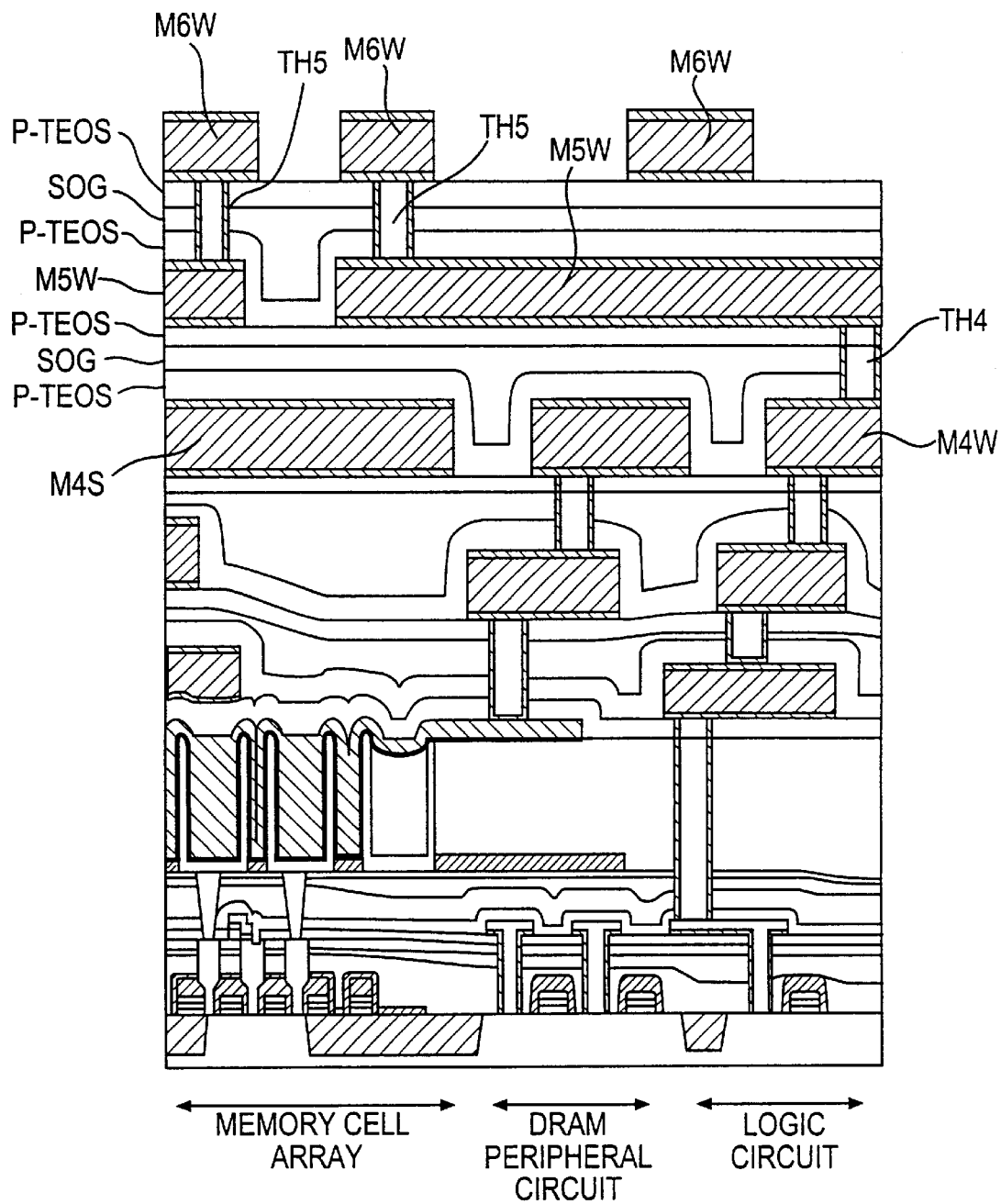
FIG. 8 shows a cross-sectional structure for explaining the process of forming the sixth-layer metal wiring in a semiconductor device according to an embodiment of the present invention.

As shown in FIG. 8, a structure including the sixth-layer metal wiring is formed by alternatively forming inter-layer insulating films (each having a triple-structure of P-TEOS, SOG and P-TEOS) and metal wiring over the fourth-layer metal wiring. Referring to FIG. 8, TH4 represents a via hole through which the metal wiring M4W is connected to the metal wiring M5W. TH5 represents a via hole through which the metal wiring M5W is connected to the metal wiring M6W. M5W represents the fifth-layer metal wiring formed between logical blocks and M6W represents the sixth-layer metal wiring formed between logical blocks. As shown in FIG. 8, since there is a shielding conductor M4S between the wirings and memory cells, the problem of noise can be avoided as described above.

Figure 9:
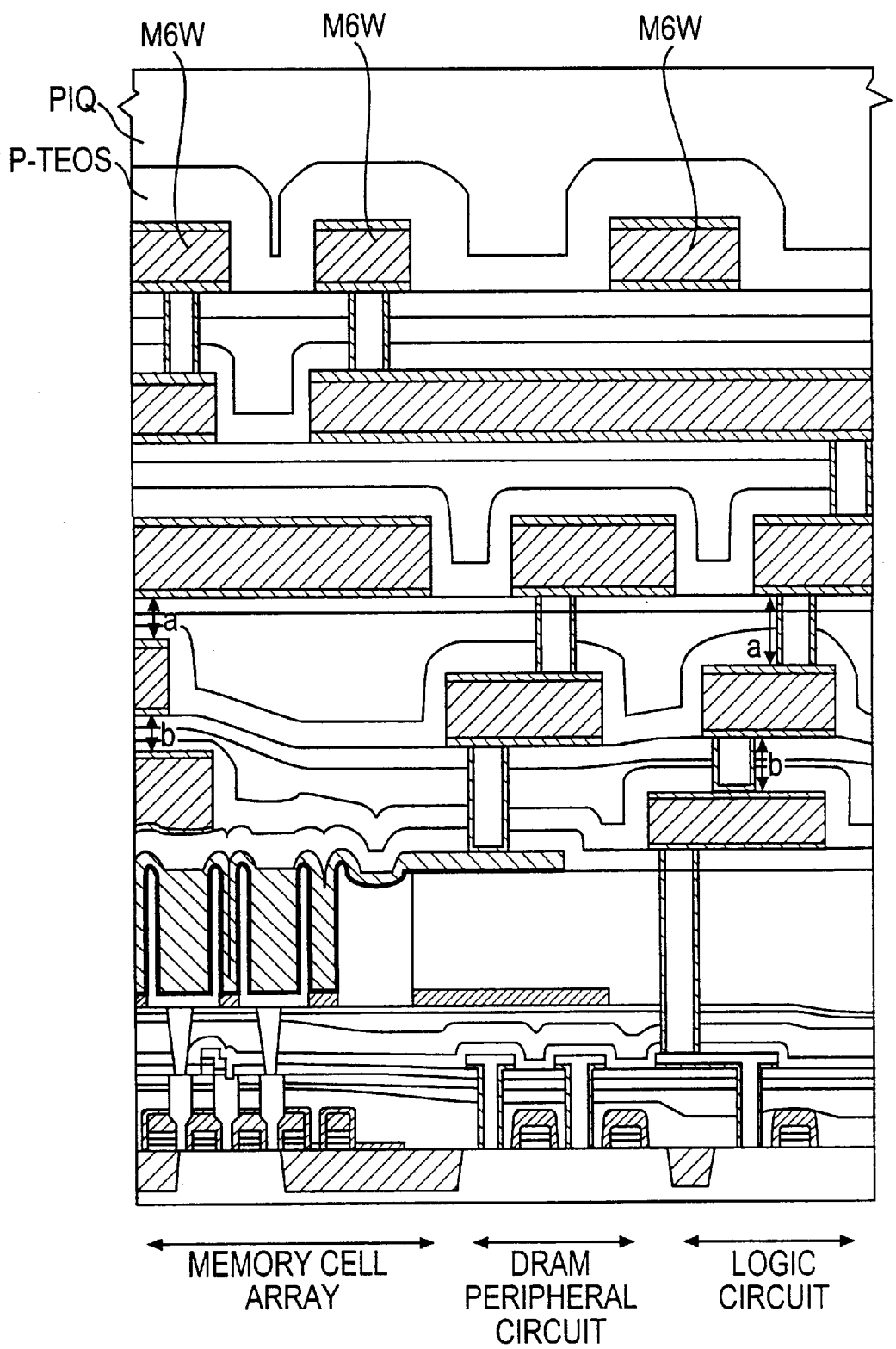
FIG. 9 shows a cross-sectional structure for explaining the process of performing the final coating step in a semiconductor device according to an embodiment of the present invention.

Finally, as shown in FIG. 9, an oxide film P-TEOS is formed over the sixth layer by a chemical vapor deposition method to protect the sixth layer. Thereafter, a polyimide resin film PIQ is formed by coating to protect the chip surface.

In the embodiment described with reference to FIGS. 6 to 9, in order to relieve mutual interference between the upper wirings and the data line of the DRAM by the shielding conductor and to prevent the data line capacity from being increased due to the capacitance between the data line and the shielding conductor, it is desirable to sufficiently separate the shielding conductor from the data line by increasing the thickness the insulating film between metal wirings beneath the shielding conductor. In the present embodiment, since the insulating film beneath the shielding conductor is sufficiently thick, the thickness a of the insulating film formed between the fourth-layer metal wiring, where the shielding conductor is formed, and the third-layer metal wiring under the fourth-layer metal wiring is larger than the thickness b of the insulating film formed between the third-layer metal wiring and the second-layer metal wiring. Thicknesses a and b are shown in FIG. 9. Thus, the shielding conductor can be sufficiently separated from the data line without increasing the thickness of the insulating film sandwiched between the second-layer metal wiring and the third-layer metal wiring which are used for many wirings within the logical blocks and the memory blocks.

In the embodiment shown in FIGS. 6 to 9, since the shielding conductor over the DRAM memory array and the wiring conductor formed between logical cells within the logical block can be simultaneously formed by using the fourth-layer metal wiring, the process cost can be decreased. The fifthand sixth-layer metal wirings passing over the shielding conductor allow the wirings between logical blocks to be provided. Since the portion above the memory cell can be used as a wiring region, chip area increases due to the wirings arranged between logical blocks is prevented. Decreasing the chip area leads to an increase in yield and a decrease in production cost. Moreover, a shortened wiring length enables reduced wiring delay and high speed operation. As described above, in the present embodiment, a high performance DRAM/logic hybrid chip can be realized at a low production cost.

Figure 10:
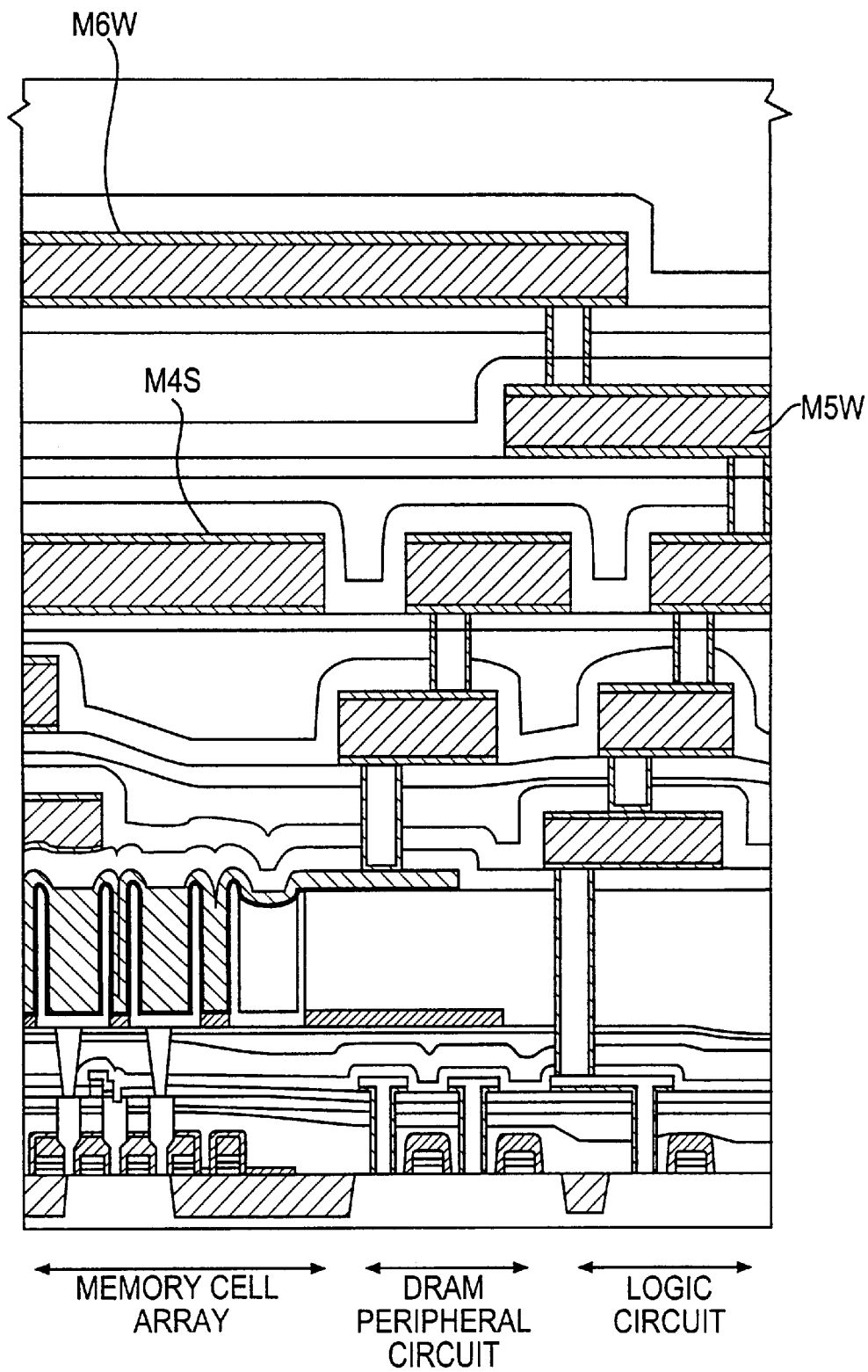
FIG. 10 shows a cross-sectional structure of a semiconductor device according to another embodiment of the present invention.

FIG. 10 shows a semiconductor device structure according to another embodiment of the present invention. In comparison, the semiconductor device whose cross-section is shown in FIG. 10 differs from that shown in FIG. 9 in that only the sixth-layer wiring M6W passes over the upper portion of the shielding conductor M4S and between logical blocks. The other portions are identical to those of the semiconductor device shown in FIG. 9. In this embodiment, when only one wiring passes over the shielding layer, the wiring M6W is used without using the wiring M5M just above the shielding layer. This way, the influence of noise between the data line in a DRAM and the wirings disposed over the shielding conductor between logical blocks are further reduced.

Next, another embodiment of the present invention will be described below referring to FIG. 11.

Figure 11:
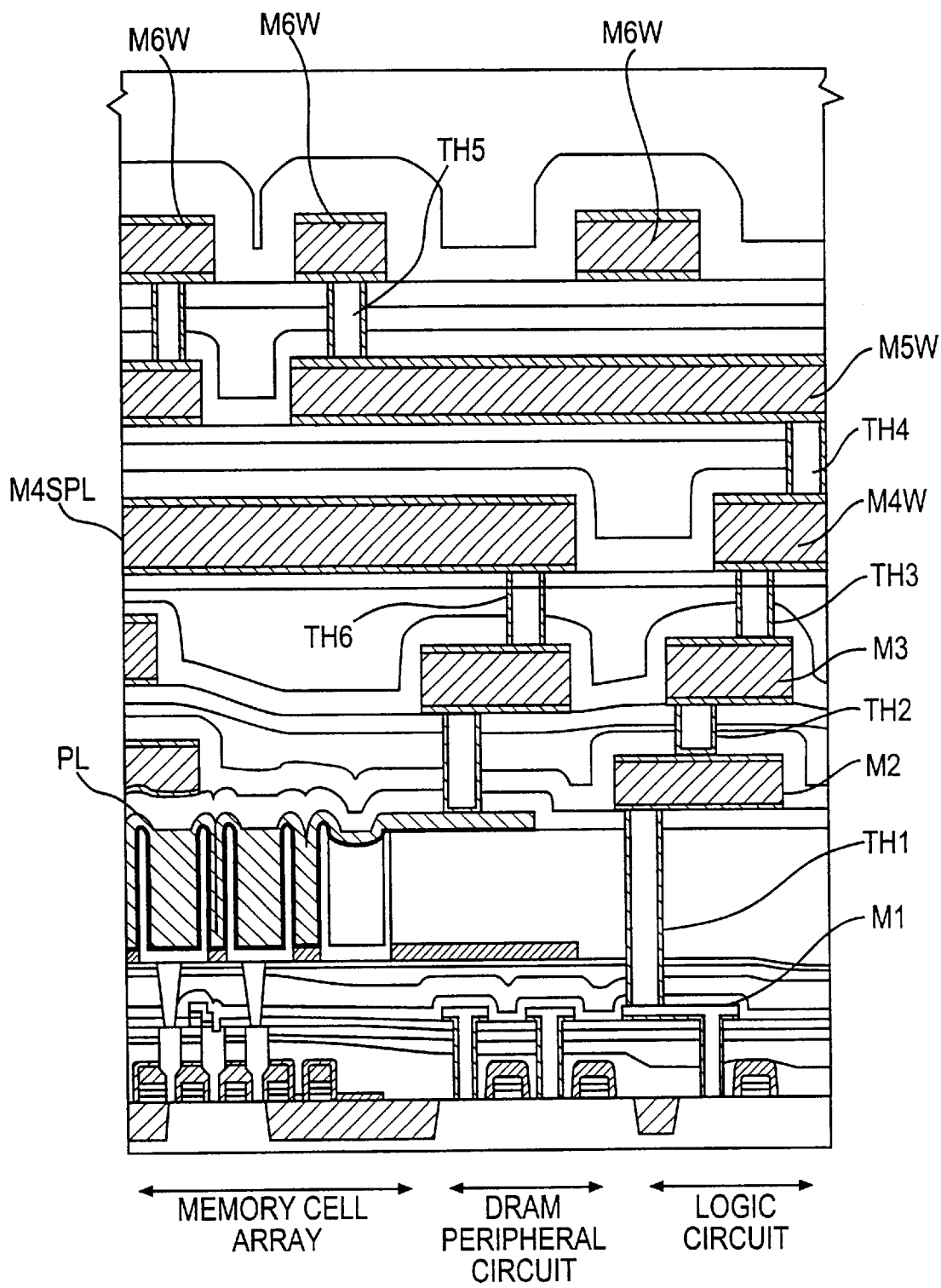
FIG. 11 shows a cross-sectional structure of an example of a semiconductor device in which a shielding conductor is also connected to the plate electrode of a capacitor, according to another embodiment according to the present invention.

FIG. 11 shows an embodiment where the shielding conductor acts as a means for supplying power to a capacitor plate. The semiconductor device of this embodiment is identical to the semiconductor device described with FIGS. 6 to 9, except that the shielding conductor is connected to the plate layer PL. M1 represents a first-layer metal wiring. M2 represents a second-layer metal wiring. M3 represents a third-layer metal wiring. TH1 represents a via hole through which the firstlayer metal wiring is connected with the second-layer metal wiring. TH2 represents a via hole through which the second-layer metal wiring is connected with the third-layer metal wiring. M4W represents a wiring formed between logic cells within a logical block. M5W represents a wiring formed of the fifth-layer metal wiring between logic blocks. M6W represents a wiring formed of the sixth-layer metal wiring between logic blocks. TH4 represents a via hole through which the metal wiring M4 is connected to the metal wiring M5. TH5 represents a via hole through which the metal wiring M5 is connected to the metal wiring M6. The shielding conductor M4SPL covers the upper portion of a memory cell array and is connected to the third-layer metal wiring M3 through the via hole TH3. The shielding conductor M4SPL is further connected to the plate layer PL through the via hole TH6. From the shielding conductor M4SPL, a wiring is led out to the upper-layer wiring at a predetermined place (not shown) and is connected to the bonding pad for feeding power to maintain the shielding conductor at a predetermined potential.

In the present invention, since the shielding conductor which is biased to a predetermined potential also acts to feed power to the plate layer of a capacitor, it is unnecessary to independently dispose wiring for feeding power to a capacitor separately from the shielding conductor. Moreover, since the bonding pad for feeding power to maintain the shielding conductor at a predetermined potential can be used for both capacitor power feeding and shielding, the wiring structure is not complicated, so that an increase in chip area can be prevented.

As described above, according to the present invention, the conductor which is maintained at the equipotential shields the upper portion of the DRAM. The shielding conductor may be formed to cover the entire surface of the DRAM. However, the problem is that the large surface area may cause the shielding conductor to be easily separated. In order to overcome such a problem, it is desirable that the semiconductor device has a mesh structure shown in FIG. 12.

Figure 12:
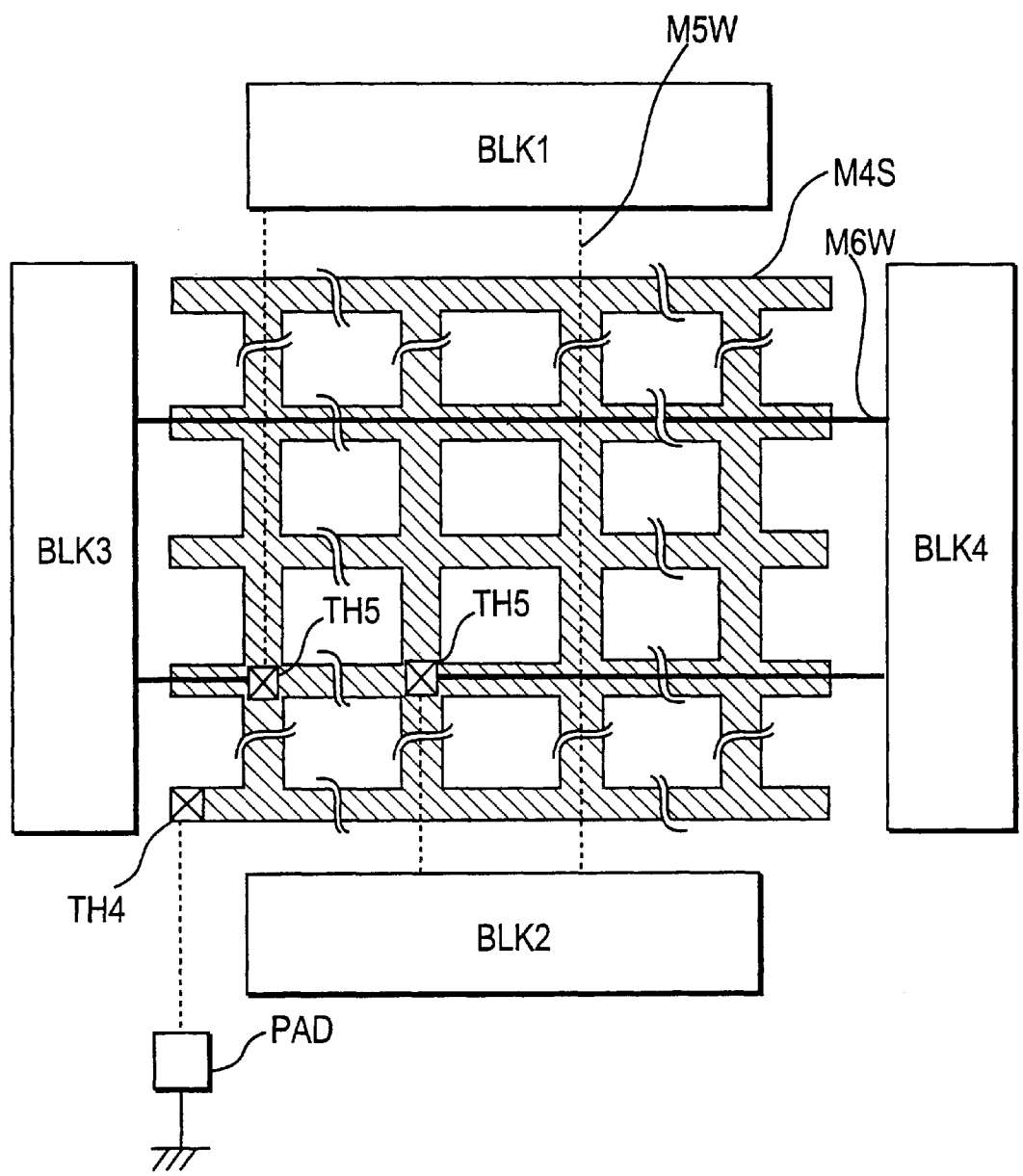
FIG. 12 shows an example of the layout pattern of a shielding conductor.

FIG. 12 is a diagram illustrating an example where the layout pattern of a shielding conductor viewed from above perpendicularly to the semiconductor substrate. In FIG. 12, BLK1, BLK2, BLK3, and BLK4 represent logical blocks. M4S represents the fourth-layer metal wiring (shielding conductor) for shielding the upper portion of a DRAM. M5W represents the fifth-layer wiring extending between logical blocks BLK1 and BLK2 while M6W represents the sixth-layer wiring extending between logical blocks BLK3 and BLK4. TH5 represents via holes for connecting the wiring M5W to the wiring M6W. PAD represents a bonding pad for supplying power to the shielding layer through via hole TH4.

In the present embodiment, the shielding layer has a mesh structure while a portion above the shielding layer can be used for the wiring between logical blocks. Hence, the problem that the shielding layer tends to be separated can be avoided even in the case of a large area memory array. The present embodiment shown is an example where one wiring passes over the shielding conductor M4S. However, the width of the wiring M4S can be designed so as to pass multiple wirings. Ordinarily, the signal wirings are arranged at predetermined intervals generally called wiring pitches. Hence, it is desirable to design the width and position of the shielding conductor according to the wiring pitch. Thus, the wirings between logical blocks can be effectively made using an automatic arranging/routing computer aided design (CAD) tool.

In some memory cell structures, where the shielding layer is disposed over the DRAM, the data line capacitance may increase due to the capacitance between the data line and the shielding layer. In this case, the problem of a decrease in the signal amount read from the DRAM may arise. In the embodiment described with reference to FIGS. 6 to 9, since the data lines of the DRAM lie under the memory cells, the above-mentioned problem is not serious. However, in the case of the so-called trench type memory cell in which a memory cell is formed in a semiconductor substrate, the above-mentioned problem may become more serious.

Figure 13:
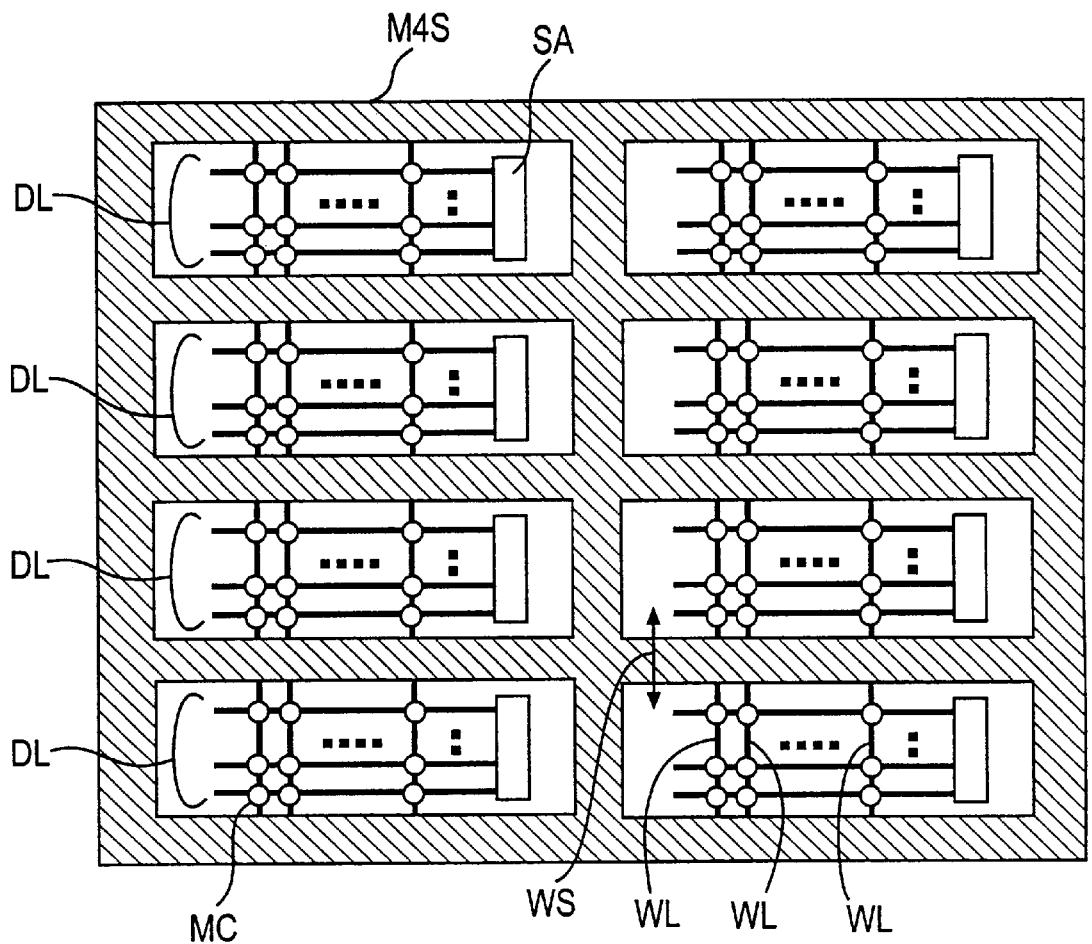
FIG. 13 shows another example of the layout pattern of a shielding conductor.

In such a case, the embodiment shown in FIG. 13 is effective. In FIG. 13, DL represents data lines; WL represents word lines; and SA represents a sense amplifier. In the present embodiment, the shielding layer M4S is so disposed as to avoid the data line. In such an arrangement, the shielding layer can relieve the mutual influence (the influence of noises) between the data line passing just above the shielding layer and the wirings passing between logical blocks, and can suppress an increase in data line capacitance due to the capacitance between the data line and the shielding layer. In DRAMs, the word line is often shunted with a metal wiring to reduce the resistance of the word line. In this case, as shown by WS in FIG. 13, every given multiple of data lines are separated with partition regions. On each of the partition regions, the word line is connected with a shunt metal wiring. In the present embodiment, the partition region is used for forming the shielding layer. Thus, the problem of an increase in data line capacitance can be avoided without increasing the area of the memory array. Needless to say, although not shown in FIG. 13, the signal wiring between logical blocks passes over the upper portion of the shielding layer. For the same reason as that described with reference to FIG. 12, it is, of course, desirable to form the shielding layer according to the wiring pitch. In FIG. 9, a common shielding layer (electrically connected) is disposed over the right and the left arrays. This structure is suitable where the same I/O line is used commonly or two arrays or more are closely disposed. However, according to the present invention, different shielding conductors may be formed over the right and left arrays.

While the present invention has been described above in conjunction with the preferred embodiments, one of ordinary skill in the art would be enabled by this disclosure to make various modifications to these embodiments and still be within the scope and spirit of the present invention as recited in the appended claims.

What is claimed is:

1. A semiconductor device comprising:
   a semiconductor substrate;
   a dynamic memory having a memory cell array, the memory cell array including a plurality of data lines, a plurality of word lines, and a plurality of memory cells and each memory cell including a transistor formed on the semiconductor substrate and a capacitor formed over the semiconductor substrate and having an electrode connected to the transistor and a plate electrode, the plurality of data lines being formed in a first wiring layer over the semiconductor substrate, the plurality of word lines being formed in a second wiring layer and located over the capacitors of the plurality of memory cells, the memory cell array being formed in a four-sided region in a plan-view layout of said semiconductor substrate;

a conductor formed in a portion of the semiconductor device located over the four-sided region, formed in a third wiring layer, and located over the first and second wiring layer; and a wiring formed in a fourth wiring layer located over the conductor;

wherein the conductor is biased to a predetermined potential for supplying power to the plate electrodes and connected to the plate electrodes of the capacitors of the plurality of memory cells.

2. The semiconductor device according to claim 1, further comprising:

a first logic circuit adjacent to the dynamic memory and having a first signal node and a second logic circuit adjacent to the dynamic memory and having a second signal node, wherein the wiring connects the first and second nodes over the dynamic memory.

3. A semiconductor device according to claim 1, wherein the conductor has a mesh-like shape having conductor portions adjacent to openings where no conductor portion is present and wherein wirings in the wiring layer are positioned above the conductor portions of the conductor.

4. A semiconductor device according to claim 1, wherein each of the first to fourth wiring layers includes a metal wiring layer.

* * * * *